(12) United States Patent
Gaidarzhy et al.

(10) Patent No.: US 7,990,229 B2
(45) Date of Patent: Aug. 2, 2011

(54) METHODS AND DEVICES FOR COMPENSATING A SIGNAL USING RESONATORS

(75) Inventors: Alexei Gaidarzhy, Boston, MA (US);
Klaus Juergen Schoepf, Ringwood, NJ (US); Pritiraj Mohanty, Boston, MA (US)

(73) Assignee: Sand9, Inc., Cambridge, MA (US)

(*) Notice: Subject to any disclaimer, the term of this patent is extended or adjusted under 35 U.S.C. 154(b) by 322 days.

(21) Appl. No.: 12/142,254

(22) Filed: Jun. 19, 2008

(65) Prior Publication Data

US 2009/0243747 A1    Oct. 1, 2009

Related U.S. Application Data

(60) Provisional application No. 61/041,391, filed on Apr. 1, 2008.

(51) Int. Cl.
*H04B 3/04* (2006.01)
*H03L 1/00* (2006.01)
*H03H 9/02* (2006.01)

(52) U.S. Cl. .................. 333/17.1; 333/186; 331/175
(58) Field of Classification Search ............... 333/17.1, 333/197, 186, 200; 331/154, 159, 10, 11, 331/65, 175; 73/1.37
See application file for complete search history.

(56) References Cited

U.S. PATENT DOCUMENTS

| | | | |
|---|---|---|---|
| 5,455,547 A | 10/1995 | Lin et al. | |
| 5,473,289 A | 12/1995 | Ishizaki et al. | |
| 5,491,604 A | 2/1996 | Nguyen et al. | |
| 5,537,083 A | 7/1996 | Lin et al. | |
| 5,589,082 A | 12/1996 | Lin et al. | |
| 5,640,133 A * | 6/1997 | MacDonald et al. | 333/197 |
| 5,644,271 A | 7/1997 | Molloy et al. | |
| 5,839,062 A | 11/1998 | Nguyen et al. | |
| 5,883,550 A | 3/1999 | Watanabe et al. | |
| 5,914,553 A | 6/1999 | Adams et al. | |
| 5,959,516 A | 9/1999 | Chang et al. | |
| 6,067,858 A * | 5/2000 | Clark et al. | 73/504.16 |
| 6,124,765 A | 9/2000 | Chan et al. | |
| 6,249,073 B1 | 6/2001 | Nguyen et al. | |
| 6,424,074 B2 | 7/2002 | Nguyen | |
| 6,472,954 B1 * | 10/2002 | Ruby et al. | 333/133 |
| 6,557,419 B1 | 5/2003 | Herb et al. | |
| 6,577,040 B2 | 6/2003 | Nguyen | |
| 6,593,831 B2 | 7/2003 | Nguyen | |
| 6,600,252 B2 | 7/2003 | Nguyen | |

(Continued)

FOREIGN PATENT DOCUMENTS

WO    WO 98/01948 A1    1/1998

(Continued)

OTHER PUBLICATIONS

Gaidarzhy et al., "Spectral response of a gigahertz-range nanomechanical oscillator," *Appl. Phys. Letters* 86(25):254103-1 to 254103-3 (Jun. 2005).

(Continued)

*Primary Examiner* — Robert Pascal
*Assistant Examiner* — Alan Wong
(74) *Attorney, Agent, or Firm* — Wolf, Greenfield & Sacks, P.C.

(57) ABSTRACT

Compensation of a signal using resonators as well as related methods and devices are described. Some embodiments include methods and devices for performing frequency compensation on a signal.

18 Claims, 10 Drawing Sheets

U.S. PATENT DOCUMENTS

| | | |
|---|---|---|
| 6,667,558 B2 | 12/2003 | Wong et al. |
| 6,680,660 B2 | 1/2004 | Nguyen |
| 6,710,680 B2 | 3/2004 | Niu et al. |
| 6,713,938 B2 | 3/2004 | Nguyen |
| 6,737,939 B2 | 5/2004 | Hoppe et al. |
| 6,739,190 B2 | 5/2004 | Hsu et al. |
| 6,828,713 B2 | 12/2004 | Bradley et al. |
| 6,831,531 B1 | 12/2004 | Giousouf et al. |
| 6,856,217 B1 | 2/2005 | Clark et al. |
| 6,859,113 B2 | 2/2005 | Giousouf et al. |
| 6,861,914 B2 | 3/2005 | Photiadis et al. |
| 6,909,221 B2 | 6/2005 | Ayazi et al. |
| 6,917,138 B2 | 7/2005 | Nguyen |
| 6,930,569 B2 | 8/2005 | Hsu |
| 6,943,484 B2 | 9/2005 | Clark et al. |
| 6,954,020 B2 | 10/2005 | Ma et al. |
| 6,987,432 B2 | 1/2006 | Lutz et al. |
| 6,995,622 B2 | 2/2006 | Partridge et al. |
| 7,005,946 B2 | 2/2006 | Duwel et al. |
| 7,068,125 B2 | 6/2006 | Lutz et al. |
| 7,098,753 B1 | 8/2006 | Dumitrescu et al. |
| 7,102,467 B2 | 9/2006 | Lutz et al. |
| 7,202,761 B2 | 4/2007 | Lutz et al. |
| 7,211,926 B2 | 5/2007 | Quevy et al. |
| 7,215,061 B2 | 5/2007 | Kihara et al. |
| 7,248,128 B2 * | 7/2007 | Mattila et al. .................. 331/175 |
| 7,321,267 B2 * | 1/2008 | Salonen et al. .................. 331/11 |
| 7,352,608 B2 | 4/2008 | Mohanty et al. |
| 7,492,241 B2 | 2/2009 | Piazza et al. |
| 7,504,909 B2 | 3/2009 | Tada |
| 7,545,239 B2 | 6/2009 | Hagelin et al. |
| 7,724,103 B2 | 5/2010 | Feng et al. |
| 7,791,432 B2 | 9/2010 | Piazza et al. |
| 2002/0140512 A1 * | 10/2002 | Stockton .......................... 331/11 |
| 2003/0186672 A1 | 10/2003 | Buchaillot et al. |
| 2003/0193373 A1 * | 10/2003 | McCarthy et al. ............. 331/100 |
| 2004/0227578 A1 | 11/2004 | Hamalainen |
| 2005/0073078 A1 | 4/2005 | Lutz et al. |
| 2005/0184822 A1 | 8/2005 | Mattila et al. |
| 2005/0189999 A1 * | 9/2005 | Cathelin et al. ............. 331/36 C |
| 2006/0014510 A1 * | 1/2006 | Yamamoto et al. ............ 455/260 |
| 2007/0170440 A1 | 7/2007 | Partridge et al. |
| 2007/0247245 A1 | 10/2007 | Hagelin |
| 2007/0257728 A1 | 11/2007 | Boser et al. |
| 2007/0257740 A1 | 11/2007 | Boser et al. |
| 2008/0007362 A1 | 1/2008 | Partridge et al. |
| 2008/0143217 A1 | 6/2008 | Ho et al. |
| 2008/0204153 A1 | 8/2008 | Yoshida et al. |
| 2008/0272852 A1 | 11/2008 | Six |
| 2009/0026882 A1 | 1/2009 | Steeneken et al. |
| 2009/0108381 A1 | 4/2009 | Buchwalter et al. |
| 2009/0108959 A1 | 4/2009 | Piazza et al. |
| 2009/0144963 A1 | 6/2009 | Piazza et al. |
| 2009/0267699 A1 | 10/2009 | Mohanty et al. |
| 2009/0267700 A1 | 10/2009 | Mohanty et al. |
| 2009/0294638 A1 | 12/2009 | Mohanty et al. |
| 2009/0302962 A1 * | 12/2009 | Ou-Yang ....................... 331/175 |
| 2010/0007443 A1 | 1/2010 | Mohanty et al. |
| 2010/0134207 A1 | 6/2010 | Mohanty et al. |
| 2010/0155883 A1 | 6/2010 | Wenzler et al. |

FOREIGN PATENT DOCUMENTS

| | | |
|---|---|---|
| WO | WO 98/37635 A1 | 8/1998 |
| WO | WO 02/17481 A2 | 2/2002 |
| WO | WO 2006/000611 A1 | 1/2006 |
| WO | WO 2006/083482 A2 | 8/2006 |
| WO | WO 2006/098857 A | 9/2006 |
| WO | WO 2007/072408 A2 | 6/2007 |
| WO | WO 2007/072409 A2 | 6/2007 |
| WO | WO 2007/143520 A2 | 12/2007 |
| WO | WO 2009/048468 A1 | 4/2009 |
| WO | WO 2009/134372 A2 | 11/2009 |
| WO | WO 2010/011288 A1 | 1/2010 |

OTHER PUBLICATIONS

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

International Search Report and Written Opinion from International Patent Application No. PCT/US2009/002021 mailed Jul. 23, 2009.

International Search Report and International Preliminary Report on Patentability for PCT/US2006/021298 mailed Nov. 6, 2006 and Dec. 6, 2007 respectively.

International Search Report and Written Opinion from corresponding International Application No. PCT/US2007/079078, mailed Jul. 3, 2008.

International Search Report and Written Opinion from corresponding International Application No. PCT/US2008/003793, mailed Jun. 16, 2008.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

* cited by examiner

LOOK UP TABLE (LUT)

| f | $\Delta f_P$ | $\Delta f_R$ | $\Delta I$ | $\Delta V$ |
|---|---|---|---|---|
| $f_1$ | $\Delta f_{P1}$ | $\Delta f_{R1}$ | $\Delta I_1$ | $\Delta V_1$ |
| $f_2$ | $\Delta f_{P2}$ | $\Delta f_{R2}$ | $\Delta I_2$ | $\Delta V_2$ |
| $f_3$ | $\Delta f_{P3}$ | $\Delta f_{R3}$ | $\Delta I_3$ | $\Delta V_3$ |
| $f_4$ | $\Delta f_{P4}$ | $\Delta f_{R4}$ | $\Delta I_4$ | $\Delta V_4$ |

METHODS AND DEVICES FOR COMPENSATING A SIGNAL USING RESONATORS

RELATED APPLICATIONS

This application claims priority to U.S. Provisional Patent Application Ser. No. 61/041,391 which was filed on Apr. 1, 2008, and is incorporated herein by reference in its entirety.

FIELD OF INVENTION

The invention relates generally to compensation of a signal using resonators as well as related methods and devices and, in some embodiments, to methods and devices for performing frequency compensation on a signal using mechanical resonators.

BACKGROUND OF INVENTION

Signal compensation is a common technique used to fix variations in a signal. One common signal compensation technique is frequency compensation which can be employed to rectify variations in the frequency of an output signal. For example, in amplifiers, frequency compensation is used to control frequency variations due to overshoot, ringing effects, as well as to ensure no positive feedback occurs in designs employing feedback. Other devices such as signal generators also employ frequency tuning mechanisms to generate a desired output signal. Frequency compensation is particularly important for timing and signal generating devices such as oscillators and resonators since the output of such devices can be very sensitive to frequency variations and the precision of a signal can be important for applying and utilizing timing devices.

Frequency variations can occur due to a number of factors depending on the device and/or system being used. In packaged devices, these factors can include thermal variations, package-induced stress, process-induced stress, pressure variations, and drive effect (stress due to bias). Additional factors such as nonlinearity, system noise, gas-induced friction, and material-dependent properties (e.g., stiffness, fatigue and creep) can determine how much a signal's frequency will vary. The effect of these factors can become more dominant as the system size decreases to micron and sub-micron levels, and in particular, if the devices are packaged with a wafer-level packaging approach. Since technology and market demands have driven integration of broadband capabilities into nano-scale devices, frequency compensation techniques have become important for proper operability of devices.

Several frequency compensation techniques currently exist. However, most standard compensation techniques, and in particular those used with quartz oscillators, have shortcomings, for example, in providing adequate compensation over a large spectral range. There is a need to develop improved compensation techniques.

SUMMARY OF INVENTION

Compensation methods and related devices are described herein.

According to one aspect, a device is provided. The device comprises a primary resonating structure having a first output signal and a reference resonating structure. The device further comprises a comparison element configured to compare a characteristic of the primary resonating structure to a characteristic of the reference resonating structure and to provide an output related to a comparison between the characteristics. The device further comprises a compensation circuit adapted to adjust the first output signal from the primary resonating structure based on the output from the comparison element.

According to another aspect, a method is provided. The method comprises comparing a characteristic of a primary resonating structure to a characteristic of a reference resonating structure. The method further comprises providing an output related to the comparison between the characteristic of the primary resonating structure and the characteristic of the reference resonating structure, and adjusting a first output signal from the primary resonating structure based on the output related to the comparison between the characteristics.

According to another aspect, a device is provided. The device comprises a resonating structure having a primary mode and a reference mode. A comparison element is configured to compare a characteristics of the primary mode to a characteristic of the reference mode and to provide an output related to a comparison between the characteristics. The device further comprises a compensation circuit adapted to adjust an output signal from the resonating structure based on the output from the comparison element.

According to another aspect, a timing oscillator is provided. The timing oscillator comprises a primary resonating structure having a first output signal and a reference resonating structure. The device further comprises a drive circuit coupled to the primary resonating structure; a comparison element configured to compare a characteristic of the primary resonating structure to a characteristic of the reference resonating structure and to provide an output related to a comparison between the characteristics. The device further comprises a compensation circuit adapted to adjust the first output signal from the primary resonating structure based on the output from the comparison element.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Compensation methods associated with resonator structures and related devices are discussed herein. According to some embodiments, the devices include two resonating structures which are different from each other. The methods can involve comparing a characteristic (e.g., frequency) of one resonating structure (e.g., a primary resonating structure) to a characteristic (e.g., frequency) of the second resonating structure (e.g., a reference resonating structure). By comparing the difference between the characteristics, the output of one of the resonating structures (e.g., the primary resonating structure) can be tuned to generate or maintain a desired output signal. The compensation methods can be used in connection with many devices including timing oscillators, active filters, mixers, duplexers, accelerometers, gyros, and others. Moreover, the methods can provide a cost-effective and simple approach for applying broadband and narrow-band compensation.

Figure 1:
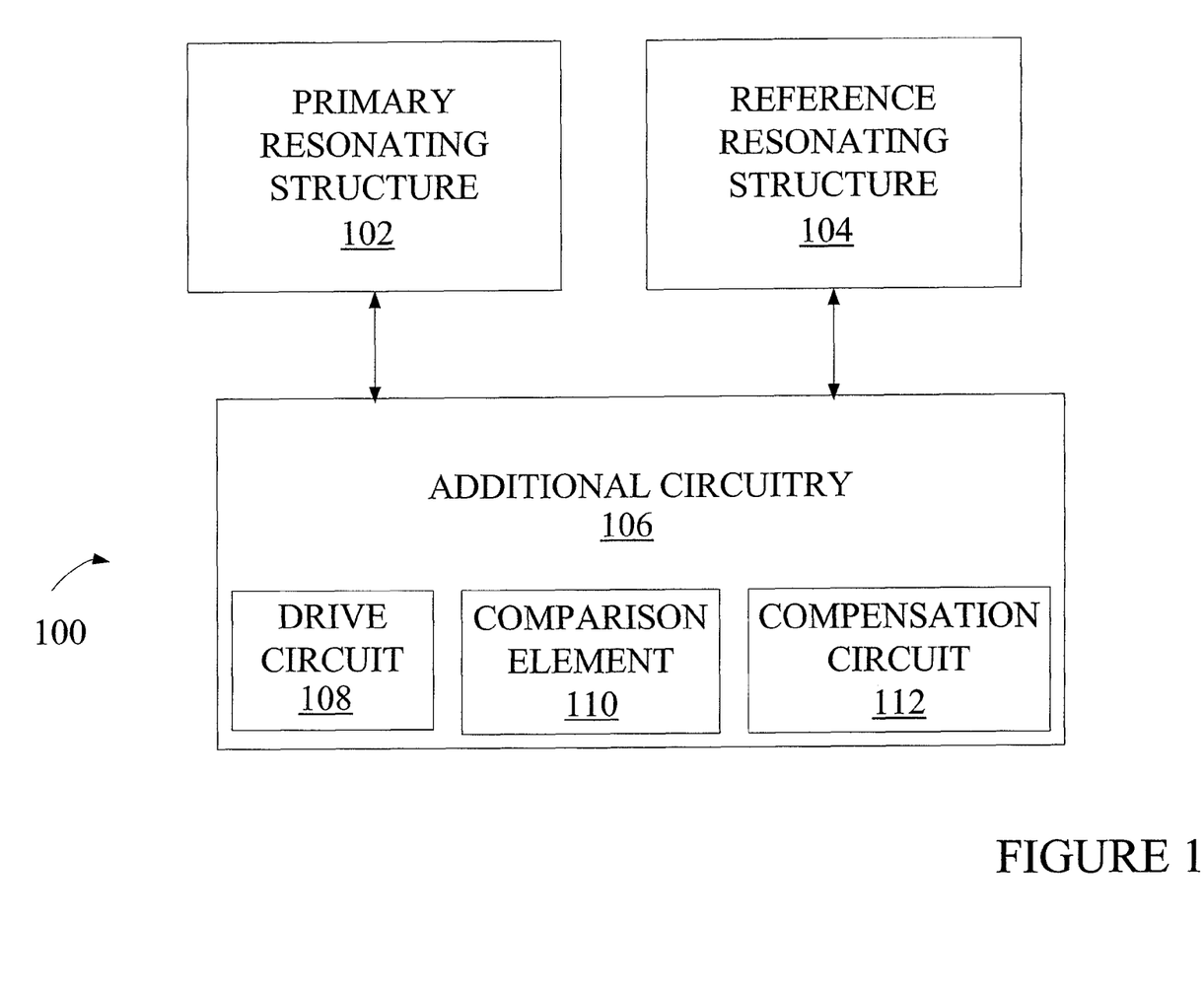
FIG. 1 shows a compensating device including two resonators and additional circuitry according to an embodiment of the present invention.

FIG. 1 illustrates a device 100 with integrated compensating mechanisms according to one embodiment of the invention. In this embodiment, the device 100 includes a primary resonating structure 102, a reference resonating structure 104, and additional circuitry 106. The primary resonating structure 102 provides the output signal of device 100. As shown, the primary 102 and reference 104 resonators are coupled to the additional circuitry 106, which can include a drive circuit 108, a comparison element 110, and a compensation circuit 112. The drive circuit is used to send input signals that drive the primary and reference resonating structures. As described further below, the comparison element may be used to determine the difference between the characteristics (e.g., frequency) of the primary and reference resonating structures; and, the compensation circuit may be used to adjust the output of the primary resonating structure based on the difference, for example, to a desired value.

In some embodiments, the primary resonating structure 102 is a passive device and is connected to a drive circuit located within the additional circuitry 106 to generate self-sustained oscillations. The oscillations occur at a resonant frequency of interest. The resonant frequency can be predetermined but is susceptible to fluctuations and needs to be monitored to generate a desired output, such as an output at a constant frequency.

In general, a variety of different resonator designs may be used for the primary resonating structure. Resonators can be circular, rectangular, square, or dome-shaped. In some embodiments of the invention, the primary resonating structure is an electrical resonator. In some embodiments, the primary resonating structure is a mechanical resonator. Suitable mechanical resonators have been described, for example, in International Publication No. WO 2006/083482 and in U.S. patent application Ser. No. 12/028,327, filed Feb. 8, 2008, which are both incorporated herein by reference in their entireties.

Figure 2:
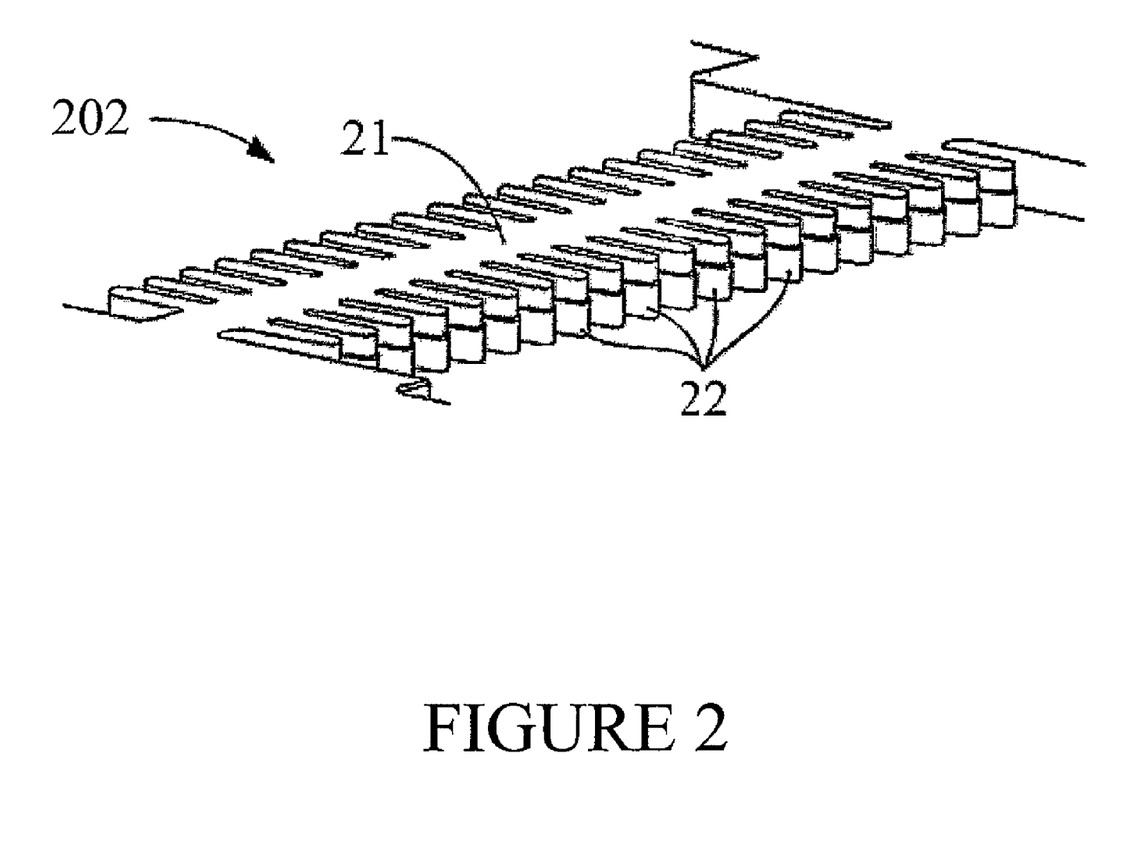
FIG. 2 shows a mechanical resonating structure with major and minor elements according to an embodiment of the present invention.

According to some embodiments, as shown in FIG. 2, a primary resonating structure 202 includes multiple minor elements 22 coupled to a major element 21. The minor elements are in the form of cantilever beams and the major element is in the form of a doubly-clamped beam which extends between two supports. During use, a drive signal provided by a drive circuit may be applied using a suitable excitation source which vibrates the minor elements at a high frequency. Vibration of the minor elements influences the major element to vibrate at a high frequency but with a larger amplitude than that of the individual minor elements. Mechanical vibration of the major element may be converted to an electrical output signal which, for example, may be further processed. The frequency produced by the primary resonating structure can, for example, vary from a few KHz up to 10 GHz, depending on the design and application.

In general, other suitable mechanical resonator designs may be used, including designs with different arrangements of major and minor elements.

Major and minor element dimensions are selected, in part, based on the desired performance including the desired frequency range of input and/or output signals associated with the device. Suitable dimensions have been described in International Publication No. WO 2006/083482 which is incorporated herein by reference above. It should also be understood that the major and/or minor elements may have any suitable shape and that the devices are not limited to beam-shaped elements. Other suitable shapes have been described in International Publication No. WO 2006/083482.

In some embodiments, the minor elements have dimensions in the nanoscale and are thus capable of vibrating at fast speeds producing resonant frequencies at significantly high frequencies (e.g., 0.1-10 GHz). The major element coupled to the minor elements then begins to vibrate at a frequency similar to the resonant frequency of the minor elements. Each minor element contributes vibrational energy to the major element which enables the major element to vibrate at a higher amplitude than possible with only a single nanoscale element. The vibration of the major element can produce an electrical signal, for example, in the gigahertz range (or higher) with sufficient strength to be detected, transmitted, and/or further processed enabling devices to be used in many desirable applications including wireless communications.

In general, the minor elements have at least one smaller dimension (e.g., length, thickness, width) than the major element. Minor elements can have a shorter length than the major element. The minor elements may have nanoscale (i.e., less than 1 micron) dimensions. In some embodiments, at least one of the dimensions is less than 1 micron; and, in some embodiments, the "large dimension" (i.e., the largest of the dimensions) is less than 1 micron. For example, minor elements may have a thickness and/or width of less than 1 micron (e.g., between 1 nm and 1 micron). Minor elements may have a large dimension (e.g., length) between about 0.1 micron and 10 micron; between 0.1 micron and 1 micron; or, between 1 micron to 100 micron. The major element can have a width and/or thickness of less than 10 micron (e.g., between 10 nm and 10 micron). The major element may have a length of greater than 1 micron (e.g., between 1 micron and 100 micron); in some cases, the major element 21 has a length of greater than 10 micron (e.g., between 10 micron and 500 micron). In some cases, the major element has a large dimension (e.g., length) of less than 500 micron.

The dimensions of the major 21 and minor 22 elements are selected, in part, based on the desired performance including the desired frequency range of input and/or output signals associated with the device. It should be understood that dimensions outside the above-noted ranges may also be suitable. Suitable dimensions have also been described in International Publication No. WO 2006/083482 which is incorporated herein by reference above. It should also be understood that the major and/or minor elements may have any suitable shape and that the devices are not limited to beam-shaped elements. Other suitable shapes have been described in International Publication No. WO 2006/083482.

Reference resonating structure 104, in general, is at least in some way different than the primary resonating structure 102. That is, the reference resonating structure is capable of having at least one different characteristic (e.g., frequency) than the primary resonating structure. In some cases, the different characteristic results from the reference resonating structure being formed of a different structure and/or a different material and/or having different properties than the primary resonating structure. For example, the reference resonating structure may vibrate at a frequency different than the primary resonating structure in response to an input signal from the drive circuit. The reference resonating structure 104 can be an electrical resonator, a mechanical resonator, or any other suitable resonator. The reference resonating structure can be independent of the primary resonating structure 104 and can output a reference signal with a programmable or tunable frequency.

Additional circuitry 106 is connected to the primary resonating structure 102 and the reference resonating structure 104 in FIG. 1 and provides means to control and monitor the resonators. The additional circuitry 106 can contain various circuitry and elements such as the drive circuit 108, a monitoring and/or compensation circuit 112, and, in general, any element or mechanism needed to effectively operate the device 100 or to tune the output signal as desired.

The drive circuitry can drive the primary resonating structure 102 and the reference resonating structure 104. In some cases, a single drive circuit can be used to drive both the primary resonating structure and the reference resonating structure. In some cases, a first drive circuit can be used to drive the primary resonating structure, while a second drive circuit can be used to drive the reference resonating structure. Suitable drive circuits, for example, can have a feedback loop that contains resistive and capacitive elements. The resistive and capacitive elements can be tuned to provide the desired signal to the resonators. A variety of suitable drive circuit designs may be used.

The additional circuitry 106 also includes a compensation circuit that tunes or applies compensation to the primary resonating structure 102 and the reference resonating structure 104. Inaccuracies in manufacturing chips and packages often result in process variations or malfunctioning components which can lead to undesirable output signals. The compensation circuit can provide the means to rectify such errors including but not limited to process variations, thermal variations, frequency compensation, and jitter. According to some embodiments, a compensation circuit can be integrated with the drive circuit or designed as a supplement to the drive circuit. The compensation circuit may include multiple circuits and compartments where each compartment is designed to perform a desired compensation function.

The compensation circuit can also execute monitoring functions to ensure that the primary resonating structure's signal integrity and quality is maintained. For example, the compensation circuit can include monitoring mechanisms, such as sensors and/or detectors, that monitor the external and internal conditions (e.g., temperature, heat and humidity) of device 100 and/or monitor signal quality factors (e.g., frequency, phase, noise, amplitude), for example, of the output signal. In general, any suitable monitoring mechanism may be used including suitable sensors and/or detectors. If the device conditions deteriorate and/or the output signal is compromised, monitoring mechanisms within the compensation circuit can rectify the problem. The monitoring mechanisms may be implemented as part of the compensation circuit or as a separate monitoring circuit. In general, any suitable compensation circuit configuration and any suitable monitoring mechanism may be implemented.

According to some embodiments of the invention, the signal generated by the reference resonating structure 104 is compared, using the comparison element, to the signal generated by the primary resonating structure 102. One or more characteristics of the primary signal and the reference signal can be compared. For example, the frequency generated by the two signals can be compared. Other characteristics that can be compared include velocity, acceleration, displacement, angular velocity, angular acceleration, and torque.

Signal quality factors and parameters of the primary and reference resonating structures can be recorded and monitored by the additional circuitry 106. Factors such as thermal variations, noise, elasticity, stress, pressure, applied strain, and electrical biases including voltage, electric field, and current as well as resonator materials, properties, and structure, can affect the output of a resonator. Monitoring these factors is useful to develop a relationship between a resonator's output signal's contributing factors and the resonator's output signal characteristics. Understanding these relationships allows one to have more control over the generated output signals.

Figure 3:
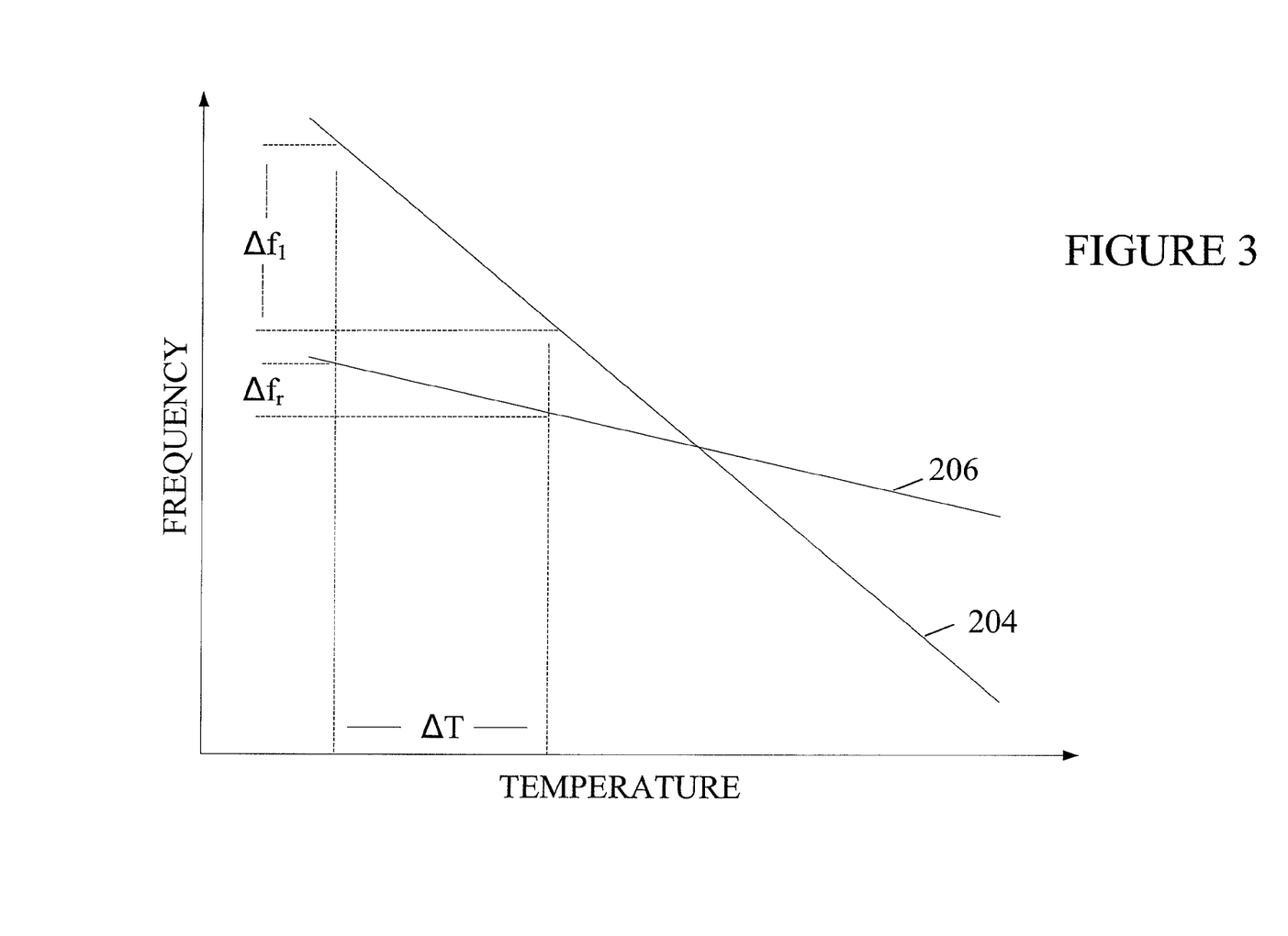
FIG. 3 shows a frequency-temperature relationship of two resonators according to an embodiment of the present invention.

A characteristic-factor graph as shown in FIG. 3 can be utilized to determine how much compensation needs to be applied to the primary resonating structure. Sensors associated with the compensating device can be used to monitor a characteristic (e.g., frequency) and/or factors (e.g., temperature) of the primary and reference resonating structure in real-time. Characteristics of each resonator can be derived as a function of its unique and distinct set of factors (e.g., temperature, noise).

For example, FIG. 3 illustrates the relationship between a factor, temperature, and a characteristic, frequency, of the primary resonating structure 102 and the reference resonating structure 104. It can be appreciated from FIG. 3 that as a resonator's temperature rises, the output frequency declines. This behavior is evident from the linearly negative slope of both resonators' temperature-frequency curves 204 and 206. For silicon-based resonators operating in the range of −40° C. to 85° C., the slope is approximately −20 ppm/K. In the example shown in FIG. 3, the primary resonating structure 102 has a steeper slope 204 than the slope 206 of the reference resonating structure 104. However, this may not always be the case and other types of behavior may also be observed. The linearity and slope of a resonator's temperature-frequency curve depends on several factors including the type of resonator, parameters, and characteristics being compared. FIG. 3, thus, illustrates an example showing the varying character-factor relationships of different resonators.

According to embodiments of the invention, the current values of the primary and reference resonating structures' characteristics can be obtained using detectors and/or sensors, and subsequently the operating conditions of the primary resonating structure may be modified to yield the desired characteristic output value. For example, the frequency of the primary and reference resonating structure can be monitored. If the primary resonating structure is not generating a signal at a desired frequency, the primary resonating structure is compensated accordingly.

According to some embodiments of the invention, the compensation can be determined by comparing the primary resonating structure's characteristic to the reference resonating structure's characteristic. For example, when the primary resonating structure's characteristic value is measured and determined not to be at the desired value, the reference resonating structure's characteristic value can be measured. The difference between the primary resonating structure and reference resonating structure's characteristic value is determined, and the calculated difference is then correlated with the biasing conditions and parameters (e.g., current, voltage) needed to generate the primary resonating structure's desired output. A comparison element utilizes the corresponding difference and frequency information to provide the required biasing values, for example, to a compensation circuit that provides a signal to a drive circuit directing the drive circuit to control the operation of the primary resonating structure, the reference resonating structure, or both.

For example, a primary resonating structure can be designed to yield an output signal with a desired frequency. At a given instance, the frequency of the primary resonating structure's output signal may deviate to a different value. The frequency of the output signal of the reference resonating structure is then measured at the same time. The difference between the current value of the reference resonating structure's frequency and the current value of the primary resonating structure's frequency is calculated and correlated to the change needed in the primary resonating structure's frequency values. This correlation takes into account the different set of factors (e.g., noise, thermal conditions) for each resonating structure. The calculated values and frequency information of the primary and reference resonating structure are compared to a set of stored values in a comparison element and subsequently the amount of current or voltage biasing that needs to be applied to the primary resonating structure is determined.

As noted above, it should be appreciated that characteristics related to frequency, such as, a magnitude of frequency, or a difference between the desired frequency and measured frequency of a resonating structure may be compared. It should also be appreciated that characteristics not related to frequency may be compared. For example, in some embodiments of the invention, the velocity and/or acceleration produced by the primary and reference resonating structures is monitored. By comparing the velocity and/or acceleration produced by the primary resonating structure to the velocity and/or acceleration produced by the reference resonating structure, one can tune the primary resonating structure accordingly using the compensation element. The compensation element's output signal provides information related to the biasing conditions (e.g., current, voltage) needed to generate the desired output signal from the primary resonating structure. Similar techniques can be applied to compensate for other signal characteristics.

The comparison element is any element that can generate one or more outputs based on a comparison of at least two inputs (e.g., factors). Values of the inputs can be programmable (e.g., adjusted after manufacturing of a device from which input factors are acquired) and stored in the comparison element or the values can be pre-determined and stored in the comparison element. The values can represent exact values of the inputs or a certain threshold value beyond which a particular output will be generated. The comparison element may be implemented in software or hardware. According to some embodiments, a comparison element compares the characteristic of the primary resonating structure to the characteristic of the reference resonating structure.

Figure 4:
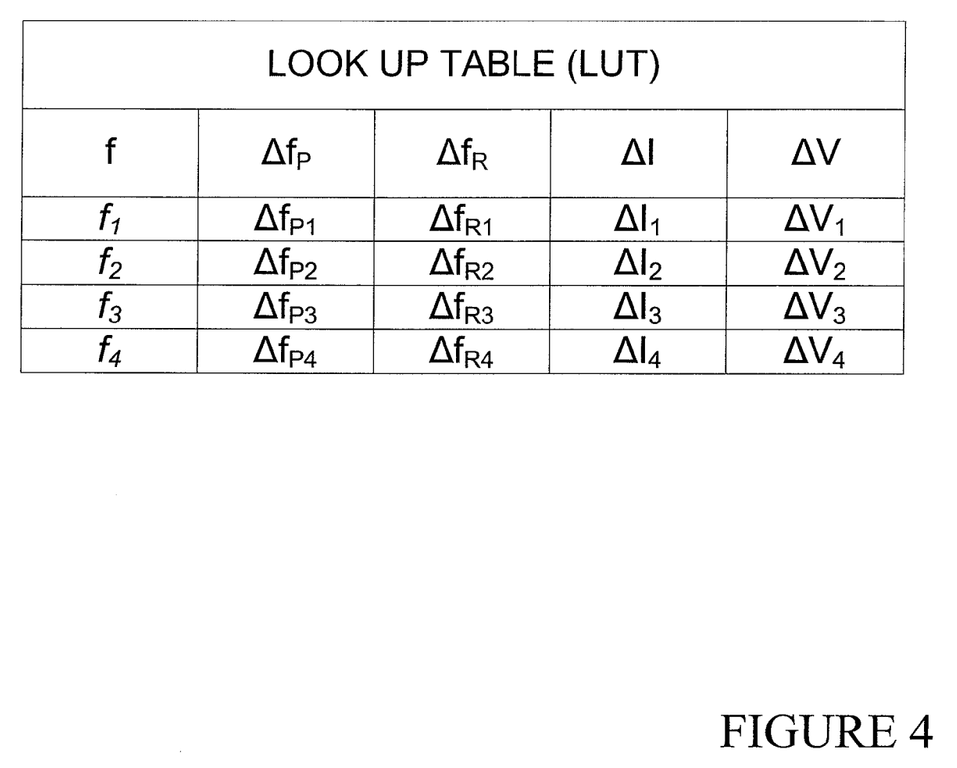
FIG. 4 shows a Look Up Table with biasing values according to an embodiment of the present invention.

One example of a comparison element is a Look-Up Table (LUT). In general, a LUT is a resource that can be employed to determine an output given certain input parameters. For example, in digital circuits, LUTs can be utilized to determine the output of logic gates provided the state of the input bits are known. In compensation devices, LUTs can be employed to determine the amount of compensation needed for a signal given the characteristic information. FIG. 4 illustrates one example of a LUT according to one embodiment of the invention. Input parameters are located in the first Is three columns, and the latter two columns indicate the change in the biasing conditions under which the desired output can be generated. The first three columns respectively indicate the current frequency of the primary resonating structure (f), the frequency change needed in the primary resonating structure's output signal ($\Delta f_P$), and the corresponding change needed in the reference resonating structure's output signal ($\Delta f_R$). The last two columns respectively indicate change in the current ($\Delta I$) and voltage ($\Delta V$) that can be applied to the primary resonating structure using the compensation circuit to generate the required frequency. By way of example, it can be seen that at a measured frequency of $f_1$, the change in frequency needed for the reference resonating structure in comparison to the desired frequency is $\Delta f_{R1}$ whereas the change in frequency in the primary resonating structure in comparison to the desired frequency is $\Delta f_{P1}$. These values correspond to a change of $\Delta I_1$ and $\Delta V_1$ in the current and voltage supply of the primary resonating structure. According to another embodiment, the first column of the LUT can indicate the desired frequency of the primary resonating structure. According to other embodiments, the first column of the LUT can indicate the current frequency of the reference resonating structure.

This simple process of using stored values in a LUT to determine the biasing conditions to generate a desired output makes LUTs very helpful in applications that involve highly complex algorithms or operations. By storing known values in the memory of a device, LUTs can provide a fast and simple output to known input parameters of a complex operation. It should be understood that various configurations and types of LUTs are possible. It should also be understood that other types of comparison elements may also be suitable.

As noted above, the comparison element generates an output signal that provides information related to compensating the output of the primary resonating structure. For example, if the output from the comparison element indicates that a change in the biasing conditions and parameters (e.g., current ($\Delta I$) and/or voltage ($\Delta V$)) is needed to produce a primary resonating structure output signal with frequency $f_{desired}$, then the compensation circuit modifies the primary resonating structure's biasing conditions and parameters. The compensation circuit may modify at least one of the biasing conditions and parameters to modify the current and/or voltage being supplied to the primary resonating structure. For example, the drive circuit can be part of the compensation circuit and may provide the current and/or voltage to the primary resonating structure. It should be appreciated that any suitable biasing parameter can be modified to generate a desired output signal.

It should be appreciated that the compensation circuit may be any suitable circuit capable of receiving signals indicative of biasing parameters for modifying the operation of the primary and/or reference resonating structures, and providing a signal, for example to a drive circuit, to modify the operation of the resonating structures accordingly. The compensation circuit may include one or more active and/or passive circuit components, either as discrete components, an integrated circuit, or any other suitable form, as the various aspects of the invention are not limited to any particular implementation of the compensation circuit.

In some embodiments, the device may include multiple primary resonating structures. Each primary resonating structure may have a separate output signal. According to some embodiments of the invention, a bank of resonators can be implemented. In such embodiments, each resonator can be designated as a primary or reference resonating structure and configured accordingly. Each primary resonating structure can be supported by a separate reference resonating structure. A reference resonating structure may be coupled to one or more primary resonating structures. In some cases, a single reference resonating structure may be used for all, or more than one, primary resonating structure. The bank of resonators can implement multiple compensation techniques, for example, frequency compensation, stress compensation, or noise compensation, on the same chip, while also generating multiple signals with varying frequencies. The bank of resonators configuration is particularly useful for devices that require continuous functionality in regions where the operating environment changes frequently, as well as in devices that require several operating frequencies.

Figure 5:
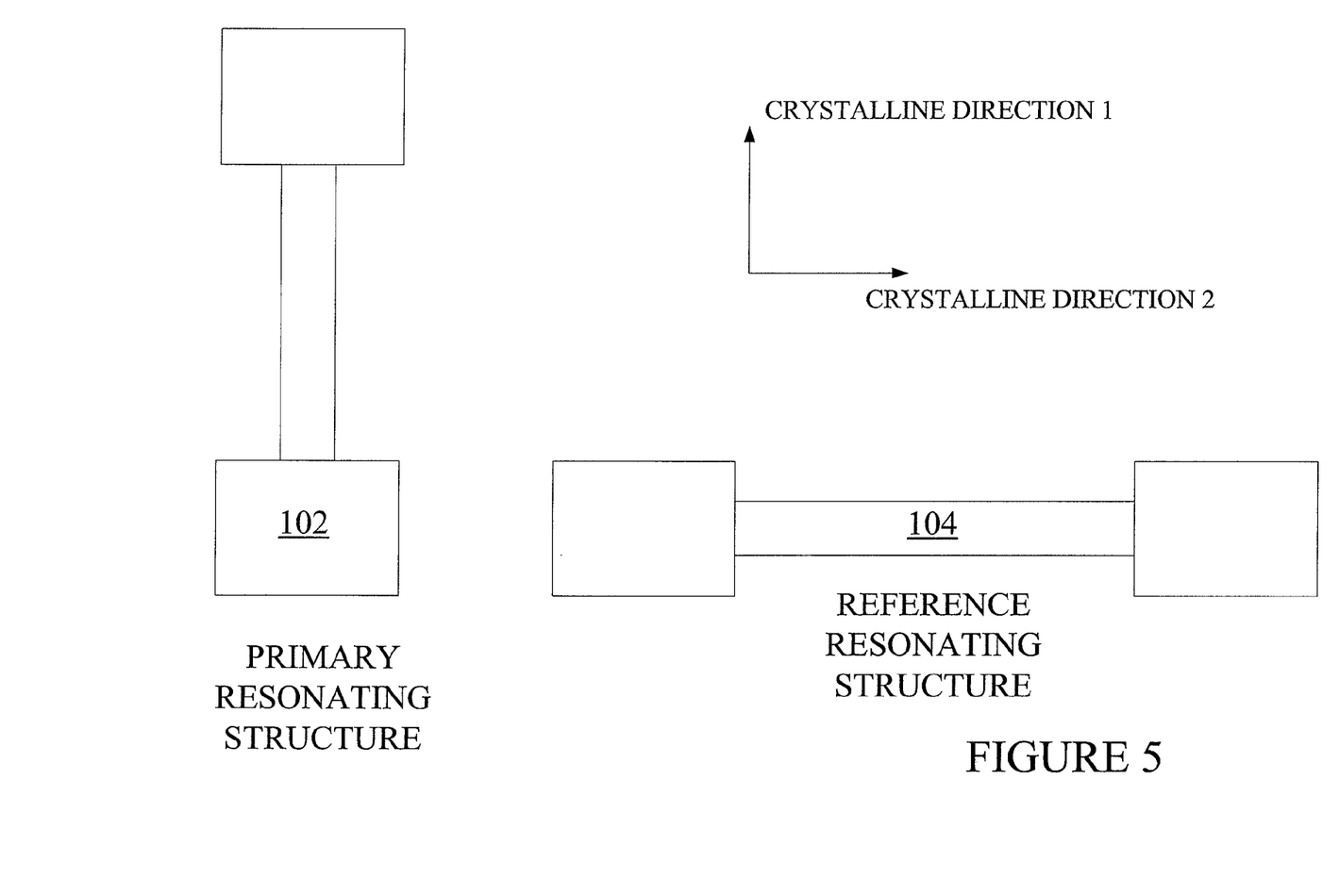
FIG. 5 shows a compensating device with resonators aligned in different crystalline directions according to an embodiment of the present invention.

As noted above, the primary resonating structure can exhibit a different characteristic than the reference resonating structure. In some cases, the primary and reference resonating structure may be formed from the same material which exhibits different material properties along different directions (e.g., crystalline axes of the material). For example, according to some embodiments of the invention, a primary resonating structure 102 can be designed having a critical dimension (i.e., dimension that determines the frequency) along a specific crystalline axis of the device 100, while the critical dimension of a reference resonating structure 104 is aligned along a different crystalline axis. In the illustrated embodiment shown in FIG. 5, the primary resonating structure 102 has a critical dimension in a vertical alignment whereas the reference resonating structure 104 has a critical dimension in a horizontal alignment. Since, elastic constants and other relevant mechanical and thermal properties of most materials are different along different crystalline axes, the two resonators consequently acquire different frequency-temperature dependencies. For instance, in silicon, in the temperature range of −40° C. to +85° C. for commercial applications, temperature dependence of the two resonators could be linear with two different slopes. Thus, by modifying one of the signal generation factors of a resonator, namely the critical dimension, one can effectively alter the characteristic-factor (eg. frequency-temperature) relationship of a resonator.

Figure 6:
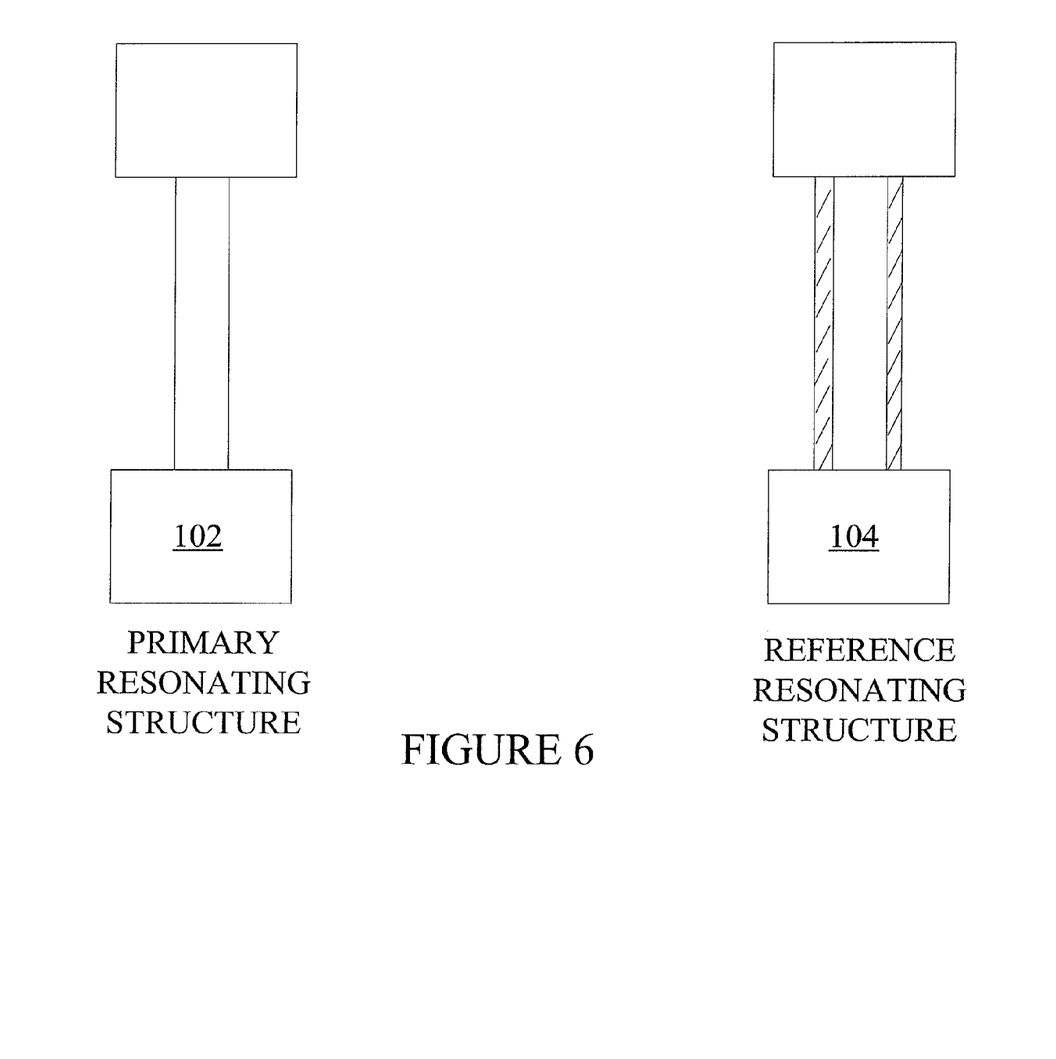
FIG. 6 shows a compensating device comprising two resonators with different structures according to an embodiment of the present invention.

In another embodiment of the invention, another factor, such as mass, can be adjusted to provide a varied parametric dependency. That is, the mass of the primary resonating structure may be different than the mass of the reference resonating structure. For example, as illustrated in FIG. 6, mass of a suitable material can be deposited on the reference resonating structure 104 to yield a desired parametric dependence in comparison to the parametric dependence in the primary resonating structure 102. This secondary deposited mass can alter parametric dependencies such as the thermal response of a material. The choice and composition of the deposited mass or materials, as well as the structure of the deposited material can be appropriately chosen to provide the desired parametric dependency. In some embodiments of the invention, multiple or single layer structures of thin films can be deposited on the reference resonating structure 104. Piezoelectric material may also be deposited on the reference resonating structure 104 to provide a varied parametric dependency due to the directional sensitivity of crystal orientation in piezoelectric material. Piezoelectric materials provided excellent performance in resonators and are commonly used in sensors, and detection and actuation systems due to their high precision and sensitivity.

Figure 7:
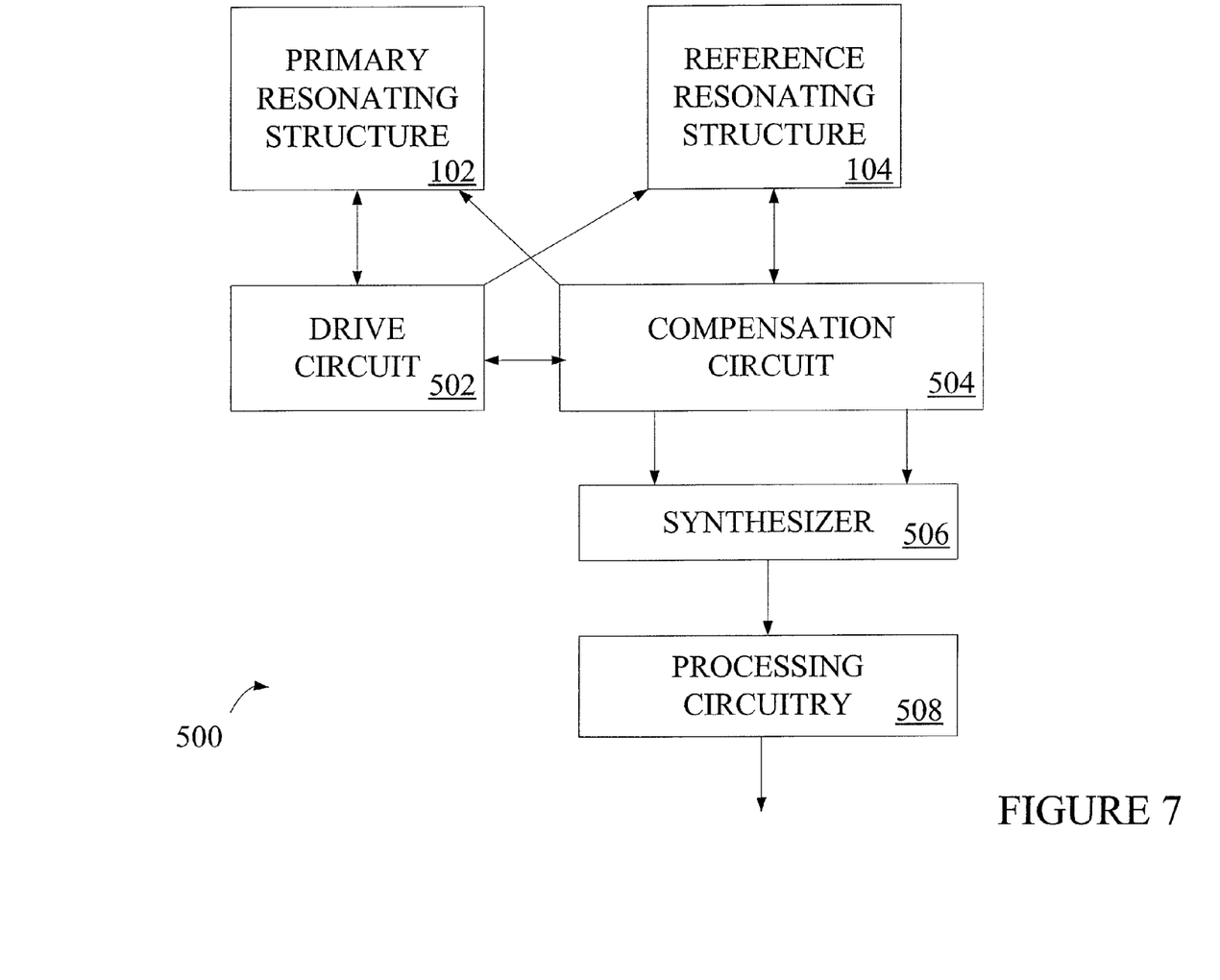
FIG. 7 shows a timing oscillator with resonators, a compensating circuit, a drive circuit, and a synthesizer according to an embodiment of the present invention.

As noted above, the compensation mechanisms can be used in variety of devices. According to some embodiments, a timing oscillator can be realized using multiple resonators and the compensation mechanisms described above. FIG. 7 shows a timing oscillator 500 with a primary resonating structure 102, a reference resonating structure 104, a drive circuit 502, and a compensation circuit 504. Suitable timing oscillators have been described in U.S. patent application Ser. No. 12/111,535, filed Apr. 29, 2008, which is incorporated herein by reference in its entirety.

In some embodiments, the timing oscillator includes a synthesizer 506 is coupled to the compensation circuit 504. The synthesizer can be external of the timing oscillator or integrated into the drive circuit 502. A Phase-Locked Loop (PLL) is an example of a synthesizer 506 that can control the phase of a signal generated from the primary resonating structure 102. According to some embodiments, the synthesizer 506 may comprise a filter, oscillator, or other signal processing devices well known to one of skill in the art. For example, the synthesizer 506 can include a phase detector to minimize the difference between a signal generated by a drive circuit 502 and a signal generated by a voltage-controlled oscillator (VCO). This process is repeated until the VCO's signal has a phase that matches the drive circuit's phase.

It should be understood that not all embodiments of a timing oscillator 500 include a synthesizer. A synthesizer is not limited to the components listed above. For example, a synthesizer may not include all the components listed above and/or may include other circuit elements, such as a charge pump, to achieve the desired performance.

According to one embodiment of the invention, the output of the timing oscillator can be coupled to a processing circuit 508. The processing circuit 508 can include any type of circuit or device to process the signal generated by the timing oscillator 500. For example, the processing circuit 508 may include filters, mixers, dividers, amplifiers, or other application specific components and devices. A generated signal can be transmitted to other devices using a transmitter built into the processing circuitry 508. Configurations and connections between the processing circuitry 508, synthesizer 506, and primary resonating structure 102 may vary depending on the type of application and generated signal desired.

Figure 8:
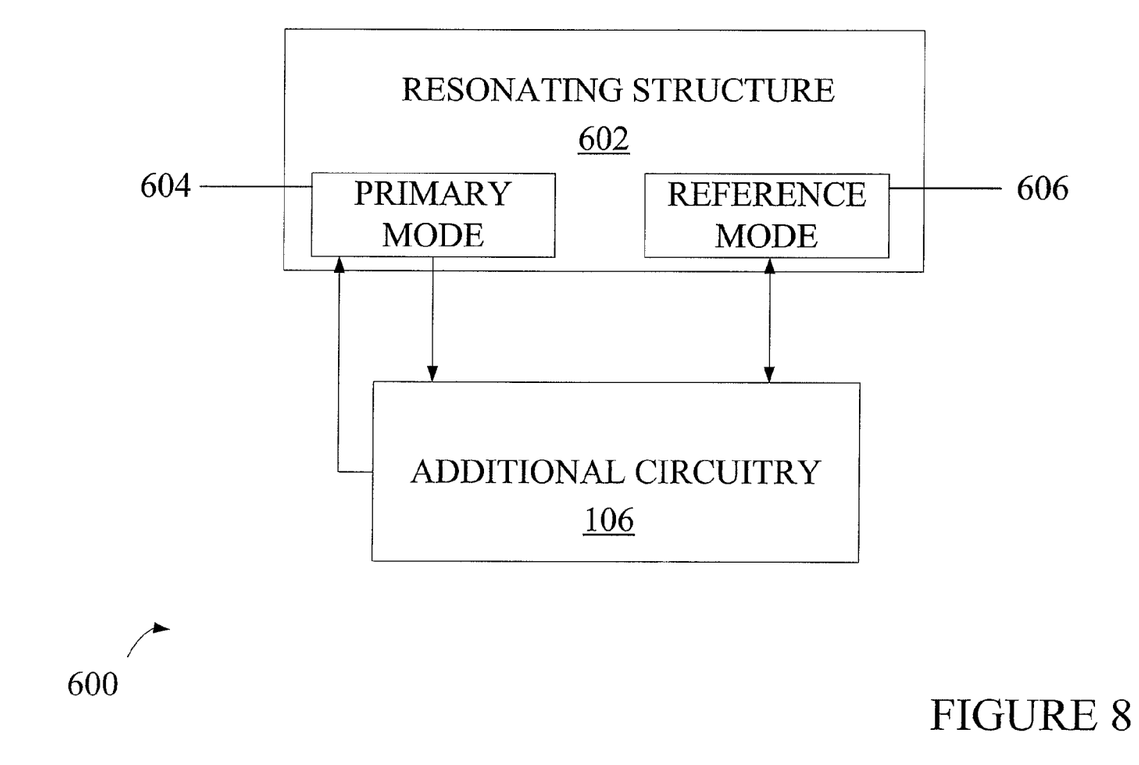
FIG. 8 shows a compensating device with a circuit and a resonator having multiple modes according to an embodiment of the present invention.

According to other embodiments, frequency compensation can be achieved using a single resonator with multiple modes (e.g., more than two modes). In such embodiments, the primary and reference resonating structures are part of the same resonating structure. FIG. 8 shows an example of a device 600 having a resonator 602 with two modes, namely a primary mode 604 and a reference mode 606. The two modes operate independently similar to the two resonators 102 and 104. Each mode 604 and 606 is coupled to additional circuitry 106, which provides the control and monitoring support as explained above.

Multiple modes are possible in a single structure due to structural and material differences within a device. For example, an electrode attached to one part (e.g., minor element) of a resonator will provide an output that is different than an output generated from an electrode attached to another part (e.g., major element). The difference in the two outputs or modes is due to several factors such as, varying shape and strain distributions of the major and minor elements.

Advantageously, according to certain embodiments of the invention, resonators may have dimensions which enable them to be incorporated into a conventional chip package. This is in contrast with certain conventional resonators and timing oscillators which have larger dimensions.

Figure 9A:
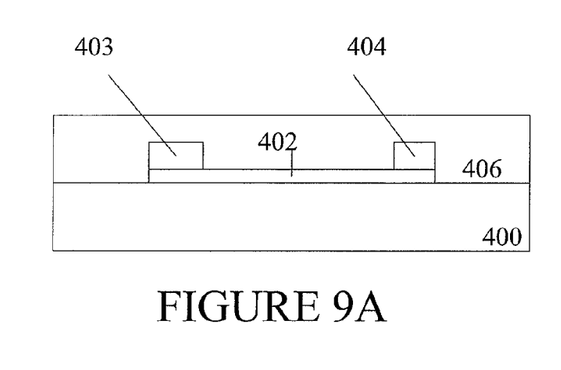
FIGS. 9A-9D show a packaged device of a compensating device according to several embodiments of the present invention.

According to one embodiment of the invention, the compensation device can be built on a single substrate. That is, all components of the compensation device may be formed on the same substrate. In some cases, additional components may also be formed on the same substrate. For example, as shown in FIG. 9A, the primary oscillator 403 and reference oscillator 404 are built on a single substrate 402 and surrounded, at least in part, by a package 406 on a single chip module 400 (e.g., circuit board). Additional circuitry can be implemented along with the resonators on the same substrate. Examples of commonly used substrates for resonators include any suitable semiconductor substrates such as silicon, III-V compounds, and the like.

Figure 9B:
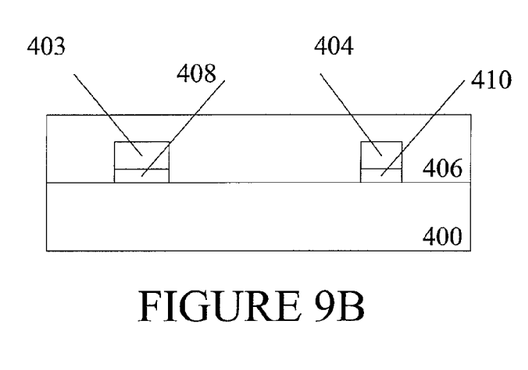

In another embodiment of the invention, the primary resonating structure and the reference resonating structure may be implemented on the same chip but with different substrates. As shown in FIG. 9B, the primary resonating structure is built on substrate 408 whereas the reference resonating structure is built on a different substrate 410. The primary resonating structure and the reference resonating structure can be integrated into a single chip module 400. The choice of substrate for the resonators may vary and can depend on the application. In some embodiments of the invention, each mechanical resonator in a bank of mechanical resonators may be prepared on a different substrate. In other embodiments of the invention in which a single resonator with multiple modes is utilized, the single resonator may be built on substrate 408 and additional circuitry on a different substrate 410.

Figure 9C:
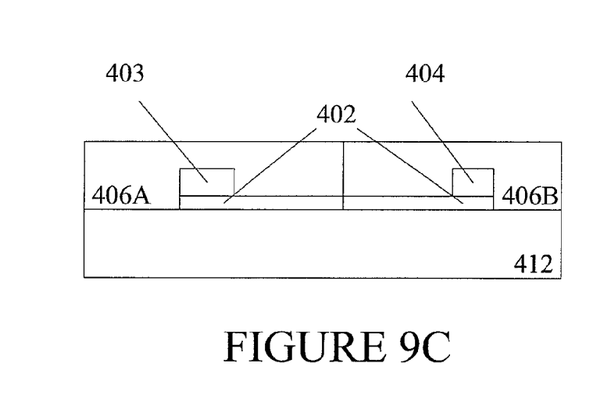

In another embodiment of the invention, the compensation device can be packaged and manufactured as separate chips and integrated into a single multi-chip module. For example, as illustrated in FIG. 9C, a primary resonating structure can be Is designed and packaged 406A separately from the reference resonating structure (packaged 406B) and planted on a multichip module 412. In this embodiment, both resonators can share the same substrate or have separate substrates.

Figure 9D:
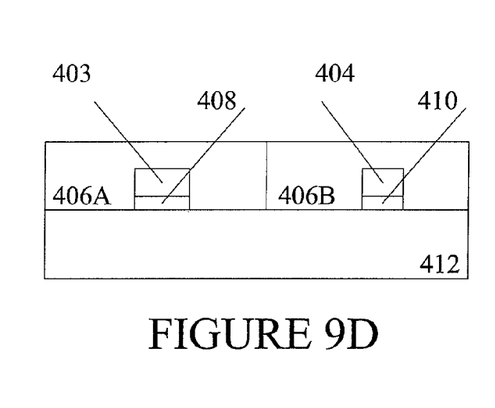

As shown in FIG. 9D, in another embodiment of the invention, the primary resonating structure and the reference resonating structure can have different substrates 408 and 410, be packaged separately 406A and 406B, and still be integrated into a single multi-chip module 412.

Figure 10:
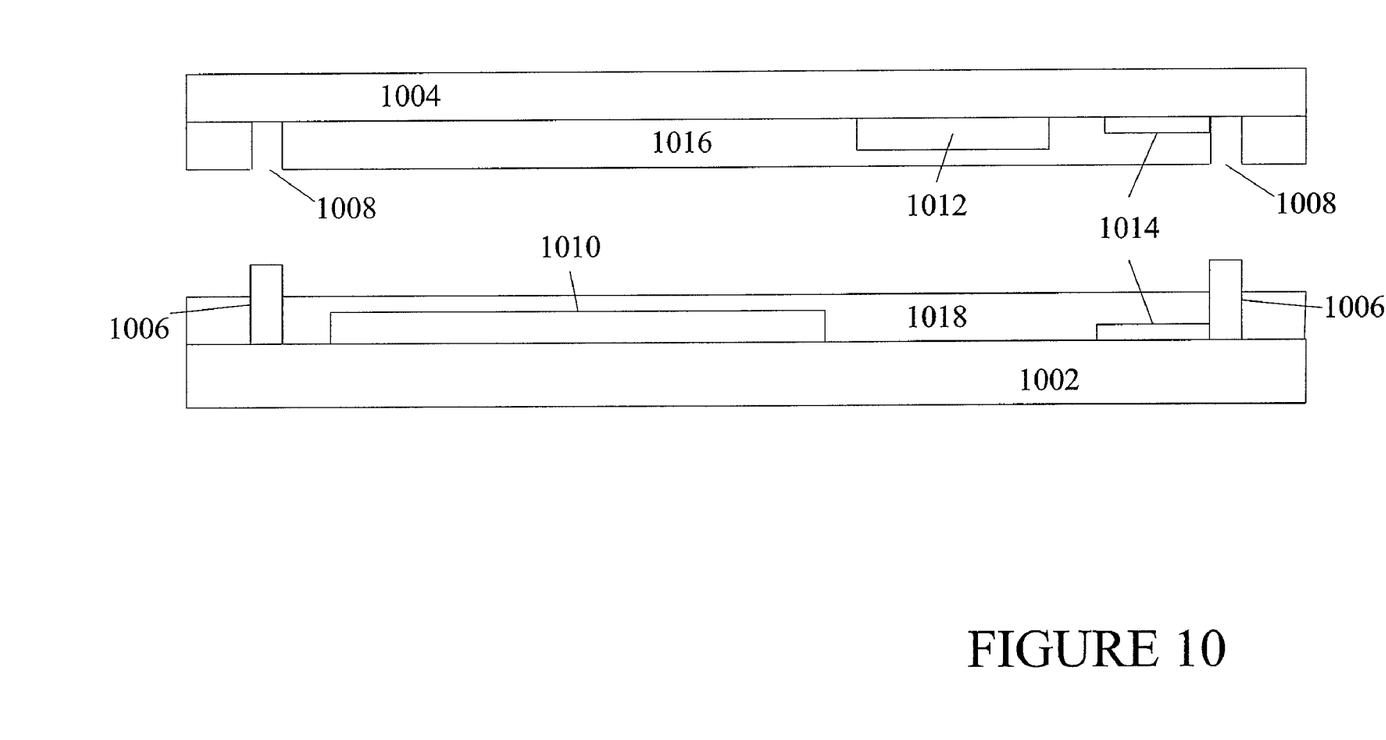
FIG. 10 shows multi-substrate packaging of a compensating device or according to an embodiment of the present invention.

According to another embodiment of the invention, the compensation device can be fabricated on two substrates in a flip-chip orientation as shown in FIG. 10. For example, a timing oscillator including the compensation device may have such a construction. In these embodiments, one or more components of the compensation device may be formed on a first substrate and one or more components are formed on the second substrate. The components on one substrate may be electrically connected to the components on the other substrate, for example, by an electrically conductive pathway that extends between the two substrates.

As shown in FIG. 10, a first substrate 1002 has a plurality of bonding sites with bumps 1006 that extends upwards. The second substrate 1004 also has a plurality of bonding sites but with holes 1008 etched onto the second substrate. The second substrate 1004 is flipped and corresponding bonding sites 1006 and 1008 of the first and second substrate are aligned so that the two substrates can be bonded together. Examples of the first substrate 1002 and/or second substrate 1004 include device and cap wafers which may include silicon, silicon germanium, or other doped and undoped semiconductor materials. Both substrates have packaging layers 1016 and 1018 implanted using packaging methods well known to one of skill in the art.

In one embodiment of the invention, a primary resonating structure or bank of mechanical resonators 1010 may be situated on the first substrate 1002. The reference resonating structure and/or additional circuitry 1012 may be situated on the second substrate. Examples of additional circuitry 1012 include and are not limited to compensation circuits, PLLs, filters, or any electronic components or devices that may be physically and functionally implemented on the second substrate 1004. The mechanical resonator 1010 may be electrically coupled to the reference resonating structure and/or additional circuitry 1012 using interconnects 514 or the bonding sites 506 and 508. According to one embodiment of the invention, the coupling may be achieved using vias filled with conductive material. In general, a via may be considered an element that allows interconnection between multiple interconnect layers of a device. It can be appreciated that the compensation methods and devices discussed herein can be used for and with various applications and devices. Examples of these devices include resonator-dependent devices such as active filters, mixers, duplexers, timing oscillators, accelerometers, mass sensors, and gyros. Examples of applications include mass spectrometry and detection using biological and chemical sensors, which can greatly benefit from these compensation methods.

Having thus described several embodiments of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A device comprising:
a primary resonating structure having a first output signal;
a reference resonating structure;
a comparison element configured to compare a characteristic of the primary resonating structure to a characteristic of the reference resonating structure and to provide an output related to the comparison between the characteristics; and
a compensation circuit adapted to adjust the first output signal from the primary resonating structure based on the output from the comparison element,
wherein the characteristic of the primary resonating structure and/or the reference resonating structure is related to frequency,
wherein the characteristic of the primary resonating structure and/or the reference resonating structure is a difference between a measured frequency and a desired frequency.

2. A device comprising:
a primary resonating structure having a first output signal;
a reference resonating structure;
a comparison element configured to compare a characteristic of the primary resonating structure to a characteristic of the reference resonating structure and to provide an output related to the comparison between the characteristics; and a compensation circuit adapted to adjust the first output signal from the primary resonating structure based on the output from the comparison element, wherein the characteristic of the primary resonating structure and the characteristic of the reference resonating structure is selected from the group of characteristics consisting of velocity, acceleration, displacement, angular velocity, angular acceleration, and torque.

3. A method comprising:

comparing a characteristic of a primary resonating structure to a characteristic of a reference resonating structure;

providing an output related to the comparison between the characteristic of the primary resonating structure and the characteristic of the reference resonating structure; and adjusting a first output signal from the primary resonating structure based on the output related to the comparison between the characteristics, wherein comparing comprises determining a first difference between the characteristic of the primary resonating structure and a desired value of the characteristic.

4. The method of claim 3, further comprising measuring the characteristic of the primary resonating structure and the characteristic of the reference resonating structure.

5. The method of claim 3, wherein comparing comprises determining a second difference between the characteristic of the reference resonating structure and a desired value of the characteristic.

6. The method of claim 3, wherein providing the output comprises correlating the characteristic of the primary resonating structure and the characteristic of the reference resonating structure with biasing parameters.

7. The method of claim 6 wherein the output related to the comparison between the characteristics comprises information related to the biasing parameters.

8. The method of claim 7, wherein the adjusting comprises modifying at least one biasing parameter of the primary resonating structure based on the information related to the biasing parameters.

9. The method of claim 3, further comprising monitoring the characteristic of the primary resonating structure and the characteristic of the reference resonating structure.

10. The method of claim 9 wherein the monitoring is accomplished using sensors and/or detectors.

11. The method of claim 3, wherein the primary resonating structure is a mechanical resonator comprising a major element and minor elements coupled to the major element.

12. The method of claim 3, wherein the characteristic of the primary resonating structure and/or the reference resonating structure is related to frequency.

13. The method of claim 3, wherein adjusting the first output signal from the primary resonating structure comprises adjusting a frequency of the primary resonating structure.

14. The method of claim 3, wherein comparing is accomplished using a comparison element comprising a look-up table.

15. A device comprising:

a resonating structure having a primary mode and a reference mode;

a comparison element configured to compare a characteristic of the primary mode to a characteristic of the reference mode and to provide an output related to the comparison between the characteristics; and a compensation circuit adapted to adjust an output signal from the resonating structure based on the output from the comparison element, wherein the primary mode has a first strain distribution and the reference mode has a second strain distribution.

16. The device of claim 15, wherein the resonating structure is a mechanical resonator comprising major elements and minor elements.

17. The device of claim 15, wherein the reference mode produces a second output signal.

18. A device comprising:

a resonating structure having a primary mode and a reference mode;

a comparison element configured to compare a characteristic of the primary mode to a characteristic of the reference mode and to provide an output related to the comparison between the characteristics; and a compensation circuit adapted to adjust an output signal from the resonating structure based on the output from the comparison element, wherein the resonating structure has at least one mode in addition to the primary mode and the reference mode.

* * * * *